US009204536B2

(12) United States Patent
Yoshiki

(10) Patent No.: US 9,204,536 B2
(45) Date of Patent: Dec. 1, 2015

(54) OPTICALLY TRANSPARENT ELECTRODE

(71) Applicant: Mitsubishi Paper Mills Limited, Sumida-ku, Tokyo (JP)

(72) Inventor: Takenobu Yoshiki, Sumida-ku (JP)

(73) Assignee: MITSUBISHI PAPER MILLS LIMITED, Tokyo (JP)

( * ) Notice: Subject to any disclaimer, the term of this patent is extended or adjusted under 35 U.S.C. 154(b) by 0 days.

(21) Appl. No.: 14/382,843

(22) PCT Filed: Mar. 26, 2013

(86) PCT No.: PCT/JP2013/058808
§ 371 (c)(1),
(2) Date: Sep. 4, 2014

(87) PCT Pub. No.: WO2013/146787
PCT Pub. Date: Oct. 3, 2013

(65) Prior Publication Data
US 2015/0075846 A1    Mar. 19, 2015

(30) Foreign Application Priority Data
Mar. 29, 2012    (JP) ................................ 2012-076637

(51) Int. Cl.
*H05K 1/00* (2006.01)
*H05K 1/02* (2006.01)
(Continued)

(52) U.S. Cl.
CPC .............. *H05K 1/0274* (2013.01); *G06F 3/044* (2013.01); *G06F 3/045* (2013.01); *H05K 1/0296* (2013.01); *H05K 1/0306* (2013.01); *H05K 1/09* (2013.01); *H05K 2201/0108* (2013.01)

(58) Field of Classification Search
None
See application file for complete search history.

(56) References Cited

U.S. PATENT DOCUMENTS

| 7,735,383 B2 * | 6/2010 | Dattalo et al. ............ 73/862.626 |
| 2007/0103446 A1 * | 5/2007 | Chien et al. .................... 345/173 |

(Continued)

FOREIGN PATENT DOCUMENTS

| JP | 10-041682 | 2/1998 |
| JP | 2003-077350 | 3/2003 |

(Continued)

*Primary Examiner* — Steven T Sawyer
(74) *Attorney, Agent, or Firm* — Fitzpatrick, Cella, Harper & Scinto

(57) ABSTRACT

The present invention provides an optically transparent electrode being resistant to corrosion regardless of the shape of the pattern and enabling uniform electroless plating thereon regardless of the shape of the pattern. The optically transparent electrode has, on a support, an optically transparent electrode unit and a peripheral wire unit formed of at least one peripheral wire, of which one end is electrically connected with the optically transparent electrode unit and the other end is connected with the outside, and the optically transparent electrode unit and the peripheral wire unit are formed of the same metal. The line width of at least one metal wire forming the peripheral wire unit is not uniform, and when the at least one metal wire is divided into a thinnest metal wire segment A and the other metal wire segment B electrically connected with the metal wire segment A, the line width of the metal wire segment A is 1.2 to 20 times the line width of the metal wires forming the optically transparent electrode unit, the line width of the metal wire segment B is 1.5 to 3 times the line width of the metal wire segment A, and the number of peripheral wires where the total length of the metal wire segment A of a single peripheral wire is 0.01 to 40 times the total length of the metal wire segment B of the same wire accounts for 40% or more of the total number of wires in the peripheral wire unit.

1 Claim, 3 Drawing Sheets

(51) Int. Cl.
*G06F 3/045* (2006.01)
*G06F 3/044* (2006.01)
*H05K 1/03* (2006.01)
*H05K 1/09* (2006.01)

(56) References Cited

U.S. PATENT DOCUMENTS

| | | |
|---|---|---|
| 2009/0277672 A1 | 11/2009 | Matsumoto |
| 2011/0308846 A1 | 12/2011 | Ichiki |
| 2011/0316803 A1* | 12/2011 | Kim ............................ 345/173 |
| 2012/0118606 A1* | 5/2012 | Kim et al. .................. 174/126.1 |
| 2014/0139763 A1 | 5/2014 | Grunthaner et al. |

FOREIGN PATENT DOCUMENTS

| | | |
|---|---|---|
| JP | 2005-250169 | 9/2005 |
| JP | 2005-340676 | 12/2005 |
| JP | 2006-040984 | 2/2006 |
| JP | 2006-100664 | 4/2006 |
| JP | 2007-188655 | 7/2007 |
| JP | 2007-287953 | 11/2007 |
| JP | 2007-287994 | 11/2007 |
| JP | 2007-288079 | 11/2007 |
| JP | 2008-113048 | 5/2008 |
| JP | 2011-029601 | 2/2011 |
| JP | 2011-523143 | 8/2011 |
| JP | 2011-210819 | 10/2011 |
| JP | 2012-4042 | 5/2012 |

\* cited by examiner

OPTICALLY TRANSPARENT ELECTRODE

TECHNICAL FIELD

The present invention relates to an optically transparent electrode and, in particular, to an optically transparent electrode preferably used for resistive touchscreens and capacitive touchscreens.

BACKGROUND ART

In electronic devices, such as personal digital assistants (PDAs), laptop computers, office automation equipment, medical equipment, and car navigation systems, touchscreens are widely used as their display screens that also serve as input means.

There are a variety of touchscreens that utilize different position detection technologies, such as optical, ultrasonic, capacitive, and resistive technologies. A resistive touchscreen has a configuration in which an optically transparent conductive material and a glass plate with an optically transparent conductive layer are separated by spacers and face each other. A current is applied to the optically transparent conductive material and the voltage of the glass plate with an optically transparent conductive layer is measured. In contrast, a capacitive touchscreen has a basic configuration in which an optically transparent support has a transparent conductor layer thereon and there are no movable parts. Capacitive touchscreens, which have high durability and high transmission, are applied, for example, to in-car equipment.

As optically transparent electrodes (optically transparent conductive material) for touchscreens, optically transparent supports having an optically transparent conductive film made of ITO (indium tin oxide) formed thereon have been commonly used. However, there have been problems of low total light transmittance due to high refractive index and high surface light reflectivity of ITO conductive films. Another problem is that ITO conductive films have low flexibility and thus are prone to crack when bent, resulting in an increased electric resistance. As an optically transparent conductive material having an optically transparent conductive film which is an alternative to the ITO conductive film, an optically transparent conductive material having a high light transmittance and a high conductivity, the material being prepared by forming, for example, a mesh-like pattern of metal thin lines on a support and by forming, for example, a mesh-like pattern of metal thin lines with a specific line width and/or pitch of the metal thin lines, a specific pattern shape, etc. on a support, is disclosed in, for example, Patent Literature 1.

As a method for forming a microscopic metal pattern, a semi-additive method for forming a metal pattern, the method comprising making a thin catalyst layer on a base material, making a resist pattern on the catalyst layer, making a laminated metal layer in an opening of the resist by plating, and finally removing the resist layer and the base metal protected by the resist layer, is disclosed in, for example, Patent Literature 2 and Patent Literature 3.

Also, in recent years, as a method for forming a metal pattern, a method using a silver halide photosensitive material as a precursor to a conductive material has been proposed. For example, Patent Literature 4, Patent Literature 5, and Patent Literature 6 disclose a technology for forming a metal silver pattern by a reaction of a conductive material precursor having a physical development nucleus layer and a silver halide emulsion layer in this order on an optically transparent support with a soluble silver halide forming agent and a reducing agent in an alkaline fluid. The patterning by this method can reproduce uniform line width. In addition, due to the highest conductivity of silver among all metals, a thinner line with a higher conductivity can be achieved as compared with other methods, and thus an optically transparent conductive film having a high total light transmittance and a reduced electric resistance can be obtained. An additional advantage is that an optically transparent conductive film obtained by this method has a higher flexibility, i.e. a longer flexing life as compared with an ITO conductive film.

In the cases of a resistive touchscreen and a capacitive touchscreen, the optically transparent electrode has an optically transparent electrode unit, which is placed on a display and is used for manual operation, and a peripheral electrode unit, which is disposed outside the display and is used for transmitting the electric signals detected in the optically transparent electrode unit to the outside. In the cases where an ITO conductive film is used in the optically transparent electrode unit, the production is generally not very efficient because, besides the step of forming the ITO conductive film, an additional step of, for example, forming a peripheral electrode unit using a silver paste or the like on top of the ITO conductive film is required. In contrast, the above-mentioned method using a silver halide photosensitive material as a conductive material precursor is a very efficient method by which, as described in Patent Literature 7, for example, a grid-like optically transparent electrode unit formed of a silver pattern and a peripheral electrode unit can be simultaneously produced.

However, despite being a noble metal, silver is not a stable metal and easily reacts with sulfur in the air to make silver sulfide, for example. Therefore, when the above-mentioned method using a silver halide photosensitive material as a conductive material precursor is employed, there is a problem regarding the stability of silver. Furthermore, in the cases where an electrode pattern is formed using silver, an inexplicable phenomenon is observed. That is, the stability of the electrode pattern varies depending on the shape of the pattern. The problem is that, although most of the pattern is hardly corroded, only a certain part, in particular, a grid-like optically transparent electrode unit electrically connected with a long peripheral wire unit is extremely susceptible to corrosion. In the method using a silver halide photosensitive material as a conductive material precursor, for further improved conductivity, a method, for example, in which the prepared grid-like optically transparent electrode unit formed of a silver pattern is plated with another metal by electroless plating is also employed. However, depending on the shape of the pattern, the electroless plating may result in non-uniform plating or the like although the reason is also unknown. In some cases, there exists a part where no plating result can be observed.

Meanwhile, Patent Literature 8 proposes changing the width of the peripheral wiring, and in this case, the peripheral wire is made of a metal, for example, molybdenum/niobium, and the optically transparent electrode unit is formed of an ITO conductive film.

CITATION LIST

Patent Literature

Patent Literature 1: JP 10-41682 A
Patent Literature 2: JP 2007-287994 A
Patent Literature 3: JP 2007-287953 A
Patent Literature 4: JP 2003-77350 A
Patent Literature 5: JP 2005-250169 A Patent Literature 6: JP 2007-188655 A
Patent Literature 7: JP 2012-4042 A
Patent Literature 8: JP 2011-523143 T

SUMMARY OF INVENTION

Technical Problem

An object of the present invention is to provide an optically transparent electrode having an optically transparent electrode unit and a peripheral wire unit, a part of the optically transparent electrode unit being electrically connected with the peripheral wire unit, the electrode being resistant to corrosion regardless of the shape of the pattern and enabling uniform electroless plating thereon regardless of the shape of the pattern.

Solution to Problem

The above object of the present invention will be achieved by the following invention.

An optically transparent electrode comprising, on a support, an optically transparent electrode unit and a peripheral wire unit formed of at least one peripheral wire, of which one end is electrically connected with the optically transparent electrode unit and the other end is connected with the outside, the optically transparent electrode unit and the peripheral wire unit being formed of the same metal, the line width of at least one metal wire forming the peripheral wire unit being not uniform, the at least one metal wire being composed of a thinnest metal wire segment A and a metal wire segment B electrically connected with the metal wire segment A, the line width of the metal wire segment A being 1.2 to 20 times the line width of the metal wires forming the optically transparent electrode unit, the line width of the metal wire segment B being 1.5 to 3 times the line width of the metal wire segment A, the number of peripheral wires where the total length of the metal wire segment A of a single peripheral wire is 0.01 to 40 times the total length of the metal wire segment B of the same wire accounting for 40% or more of the total number of wires in the peripheral wire unit.

Advantageous Effects of Invention

The present invention can provide an optically transparent electrode having an optically transparent electrode unit and a peripheral wire unit, a part of the optically transparent electrode unit being electrically connected with the peripheral wire unit, the electrode being resistant to corrosion regardless of the shape of the pattern and enabling uniform electroless plating thereon regardless of the shape of the pattern.

DESCRIPTION OF EMBODIMENTS

Figure 1:
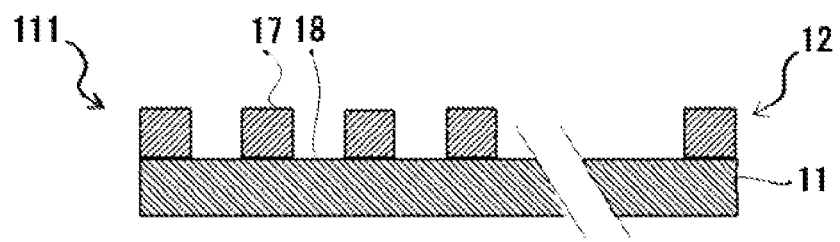
FIG. 1 is a schematic view showing a cross-section of an example of the optically transparent electrode of the present invention.
Figure 2:
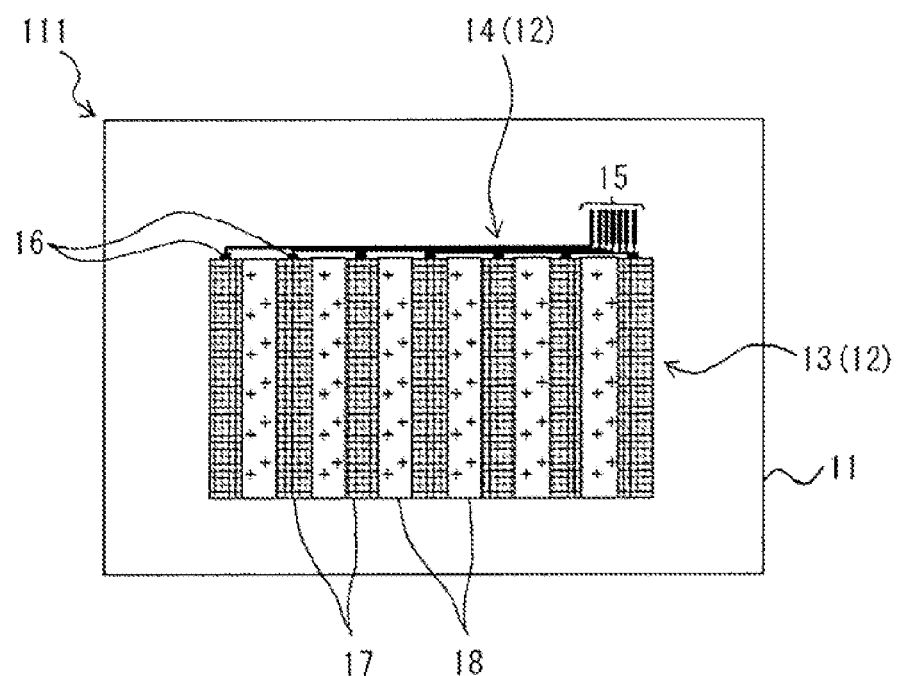
FIG. 2 is a schematic plan view showing an example of the optically transparent electrode of the present invention.

The present invention will be described in detail below referring to figures. FIG. 1 is a schematic view showing a cross-section of an example of the optically transparent electrode of the present invention. FIG. 2 is a schematic plan view showing an example of the optically transparent electrode of the present invention.

As shown in FIG. 1, an optically transparent electrode of the present invention 111 has a support 11 and at least one layer of a conductor 12. As shown in FIG. 2, the conductor 12 at least comprises an optically transparent electrode unit 13 and a peripheral wire unit 14. The optically transparent electrode unit 13 may have, in addition to a grid-like conductive section 17 connected to the peripheral wire unit 14, a broken mesh section 18 not connected to the peripheral wire unit 14. It is also possible to add a shield part (not shown) or the like to the conductor 12.

As the support 11 of the optically transparent electrode 111 of the present invention, plastics, glass, rubber, ceramics, etc. are preferably used. The support 11 is preferably an optically transparent support having a total light transmittance of 60% or more. Among plastics, flexible resin films are preferably used because of excellent ease in handling. Specific examples of the resin films used as the support include resin films made of a polyester resin, such as polyethylene terephthalate (PET) and polyethylene naphthalate (PEN), an acrylate resin, an epoxy resin, a fluorine resin, a silicone resin, a polycarbonate resin, a diacetate resin, a triacetate resin, a polyarylate resin, a polyvinyl chloride, a polysulfone resin, a polyether sulfone resin, a polyimide resin, a polyamide resin, a polyolefin resin, a cyclic polyolefin resin, etc., and the thickness is preferably 25 to 300 μm. The support may be provided with a publicly known layer, such as an easily adhering layer. In the cases where a silver halide diffusion transfer process as described later is used for forming the conductor 12, a physical development nuclei layer may be provided on the support.

The conductor 12 of the optically transparent electrode 111 of the present invention is preferably made of a metal, in particular, gold, silver, copper, nickel, aluminum, or a composite material thereof. In the present invention, the optically transparent electrode unit 13 and the peripheral wire unit 14, which form the conductor 12, are formed of the same metal (when two or more metals are used as the constituents, at least one kind thereof is the same). Preferably, the optically transparent electrode unit 13, the peripheral wire unit 14, which form the conductor 12, are produced en bloc by the same procedure. Therefore, in this case, these are all made of the same metal. As the method for forming the conductor 12, a publicly known method can be used, and the examples thereof include a method in which a silver halide photosensitive material is used, a method in which, after the use of a silver halide photosensitive material, electroless plating or electrolytic plating of the obtained silver image is performed, a method in which screen printing with use of a conductive ink, such as a silver paste, is performed, a method in which inkjet printing with use of a conductive ink, such as a silver ink, is performed, a method in which a conductive layer made of a metal, such as copper, is formed by electroless plating etc., a method in which the conductor is obtained by forming a conductive layer by evaporation coating, sputtering, etc. forming a resist film thereon, exposing, developing, etching, and removing the resist layer, and a method in which the conductor is obtained by placing a metal foil, such as a copper foil, making a resist film thereon, exposing, developing, etching, and removing the resist layer. Inter alia, a silver halide diffusion transfer process is preferably used because the metal wire forming the optically transparent electrode unit 13 can be easily thinned. Examples of the silver halide diffusion transfer process include a method for having metal silver deposit on a physical development nuclei layer provided on a support, as a result of a reaction of a silver halide emulsion layer exposed in a desired pattern beforehand with a soluble silver halide forming agent and a reducing agent in an alkaline fluid, and this method is described in JP 2003-77350 A and JP 2005-250169 A. The thickness of the conductor 12 produced by these procedures is preferably 0.05 to 5 μm, and more preferably 0.1 to 1 μm.

Figure 3:
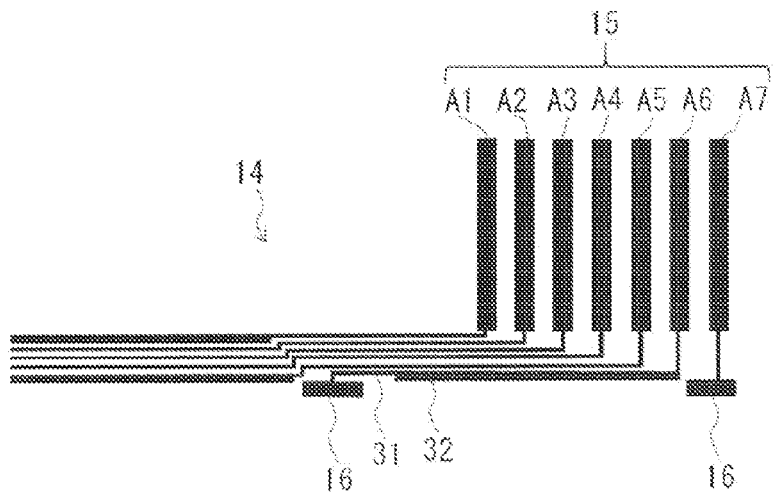
FIG. 3 is an enlarged view of the peripheral wire unit shown in FIG. 2.

FIG. 3 is an enlarged view of the peripheral wire unit shown in FIG. 2. In FIG. 3, the connector unit 15 is formed of seven connectors A1 to A7. Herein, the peripheral wire unit means a wire unit composed of a junction 16 that is electrically connected with the optically transparent electrode unit 13, the connector unit 15 that is electrically connected with the outside, and metal wires (31, 32 in FIG. 3) that electrically connect the junction 16 and the connector unit 15. In the present invention, one or more peripheral wires are collectively referred to as the peripheral wire unit. Usually, the connector unit 15 is provided so as to electrically connect with the wiring of, for example, FPC (flexible printed circuit) and through the FPC transmit the electric signals detected in the optically transparent electrode to the outside IC (integrated circuit), etc. The junction 16 is provided so as to connect at a larger number of points with the mesh pattern serving as an optically transparent electrode (the optically transparent electrode unit 13 in FIG. 2). However, in the present invention, the connector unit 15 and the junction 16 can be omitted. In this case, metal wires 31 and 32 will serve as the connector unit 15 and the junction 16.

As an example, the peripheral wire connected to the connector A6 will be described. The peripheral wire from the connector A6 to the junction 16 consists of the thinnest metal wire segment 31 (metal wire segment A in the present invention) and the metal wire segment 32 (metal wire segment B in the present invention) having a larger line width, and the both segments are electrically connected with each other. In the present invention, the line width of a metal wire means a distance in the direction perpendicular to the flow of the electric current in the metal part on the surface of the support. The line width of the metal wire segment 31 is 1.2 to 20 times the line width of the metal wires forming the grid-like conductive section 17 (see FIG. 2). The metal wire segment 31 has a rectangular bend in it. In the present invention, the line width of such a bended part means the line width of the two metal wires forming the bend. In the peripheral wire connected to the connector A6 shown in FIG. 3, the line width of the metal wire segment 32 is twice the line width of the metal wire segment 31. When the line width is in the range of 1.5 to 3 times, the objective of the present invention can be achieved.

In the present invention, the number of peripheral wires where the total length of the metal wire segment A of a single peripheral wire is 0.01 to 40 times the total length of the metal wire segment B of the same wire accounts for 40% or more of the total number of wires in the peripheral wire unit. Considering the cases where the line width of the metal wire segment A is not uniform or the line width gradually increases toward the connection with the metal wire segment B, the total length of the metal wire segment A in the present invention is defined as the total length, in a single peripheral wire, of the metal wire segment where the line width is 1.2 times or less relative to the line width of the thinnest part of the metal wire, including any transition part to a part having a different line width. Similarly, the total length of the metal wire segment B is defined as the total length, in a single peripheral wire, of the metal wire segment where the line width is 1.5 to 3 times relative to the line width of the thinnest part of the metal wire, including any transition part to a part having a different line width and excluding any metal wire segment having a line width exceeding 3 times (usually the connector unit or the junction). In FIG. 3, in the peripheral wire connected to the connector A6, the total length of the metal wire segment 31 is 0.238 time the length of the metal wire segment 32. In addition, the total of the total length of the metal wire segment A and the total length of the metal wire segment B preferably accounts for 60% or more of the total length of the peripheral wire unit including the connector unit, the junction.

In the present invention, it is not necessary that the total length of the metal wire segment A of every single peripheral wire is within the range of 0.01 to 40 times the total length of the metal wire segment B. For example, the peripheral wire connected to the connector A7 in FIG. 3 consists of one kind of metal wire part having a fixed line width. (The widths of the connector unit and the junction are larger than three times the width of this metal wire segment.) In the present invention, 40% or more of all the wires in the peripheral wire unit should meet the above requirement (the total length of the metal wire segment A is within the range of 0.01 to 40 times the total length of the metal wire segment B). Preferably 40% or more peripheral wires that are longer in terms of total length meet the above requirement, and more preferably 60% or more peripheral wires that are longer in terms of total length meet the above requirement. In FIG. 3, although not shown, the peripheral wires including the connectors A1 to A6 meet the above requirement, and only the peripheral wire including the connector A7 is outside the range. Therefore, 85.7% in terms of the number of the peripheral wires meet the above requirement.

In FIG. 2, the grid-like conductive section 17 has a geometrical shape where multiple unit lattices formed of metal wires are arranged in a grid-like manner. Examples of the shape of the unit lattice include triangles, such as an equilateral triangle, an isosceles triangle, and a right triangle; quadrangles, such as a square, a rectangle, a lozenge, a parallelogram, and a trapezoid; (equilateral) polygons, such as an (equilateral) hexagon, an (equilateral) octagon, an (equilateral) dodecagon, and an (equilateral) icosagon; and a star. One kind of these shapes may be used repeatedly, and alternatively, two or more kinds of these shapes may be used in combination. Among the above, preferred as the shape of the unit lattice are a square and a lozenge.

The line width of the metal wire forming the grid-like conductive section 17 is preferably 20 μm or less, and more preferably 1 to 10 μm. The repetition interval of the unit lattice is 600 μm or less, and more preferably 400 μm or less. The aperture ratio of the grid-like conductive section 17 is preferably 85% or more, and more preferably 88 to 99%. The aperture ratio is the calculated value of the ratio of the area where no metal wire exists (the area of optically transparent part) to the area of the unit lattices that the grid-like conductive section 17 has.

As described above, in the optically transparent electrode unit 13, a broken mesh section 18 not connected to the peripheral wire unit may be provided. In a preferred example, the broken mesh section 18 not connected to the peripheral wire unit is formed of unit lattices that are same as those forming the grid-like conductive section 17 except that the unit lattices partially have line breaks. The line break may be perpendicular to the metal wire forming the unit lattice, or obliquely crossed. The line width of the metal wire in the broken mesh section 18 is preferably the same as that in the grid-like conductive section 17 or thicker by an equivalent to the area of a line break(s). The length of a line break is preferably 30 μm or less, and more preferably 3 to 15 μm. The difference in the aperture ratio between the grid-like conductive section 17 and the broken mesh section 18 is preferably within 1%. The meaning of the aperture ratio is as described above.

As is clear from the above explanation, the present invention is characterized in the following: the line width of at least one metal wire forming the peripheral wire unit is not uniform; when the at least one metal wire is divided into a thinnest metal wire segment A and the other metal wire segment B electrically connected with the metal wire segment A, the line width of the metal wire segment A is 1.2 to 20 times the line width of the metal wires forming the optically transparent electrode unit; the line width of the metal wire segment B is 1.5 to 3 times the line width of the metal wire segment A; and the number of peripheral wires where the total length of the metal wire segment A of a single peripheral wire is 0.01 to 40 times the total length of the metal wire segment B of the same wire accounts for 40% or more of the total number of wires in the peripheral wire unit. For easier understanding, the characteristics will be described below referring to figures.

Figure 4:
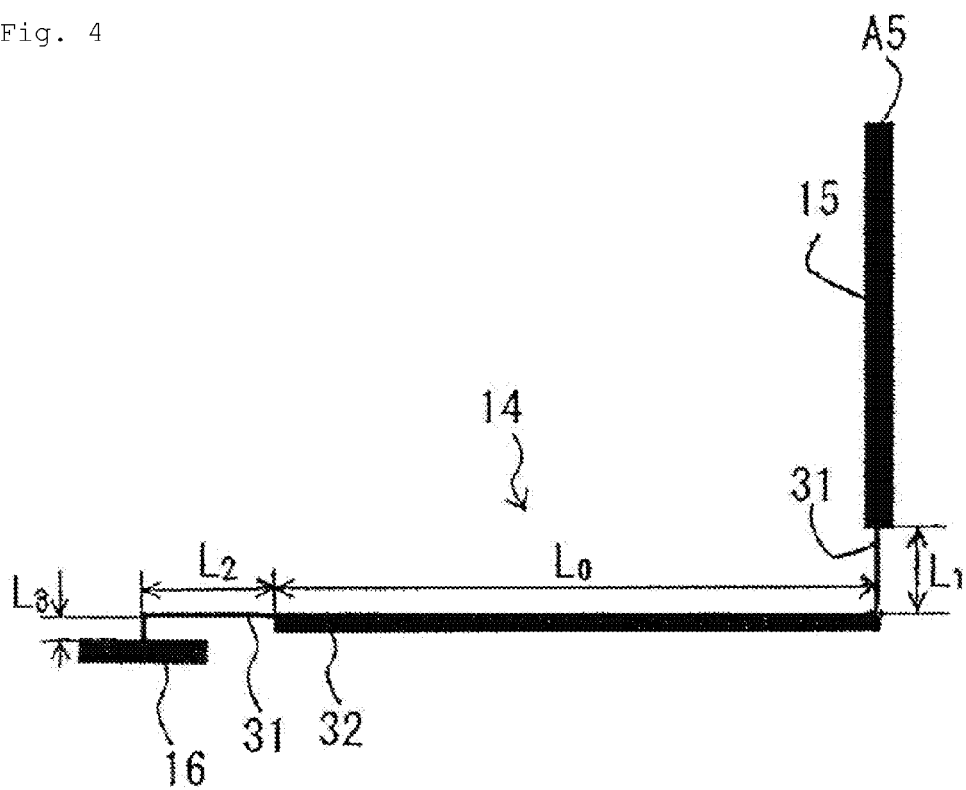
FIG. 4 is intended for explanation of the lengths of the thinnest metal wire segment A and of the other metal wire segment B in a metal wire forming the peripheral wire unit.

FIG. 4 is intended for explanation of the lengths of the thinnest metal wire segment A and the other metal wire segment B in a metal wire forming the peripheral wire unit. The total length L of the thinnest metal wire segment 31 (metal wire segment A) is the total of $L_1+L_2+L_3$. The total length of the metal wire segment 32 (metal wire segment B) having a line width larger than that of the metal wire segment A is $L_0$, leading to $0.01 \times L \leq L_0 \leq 40L$.

Figure 5:
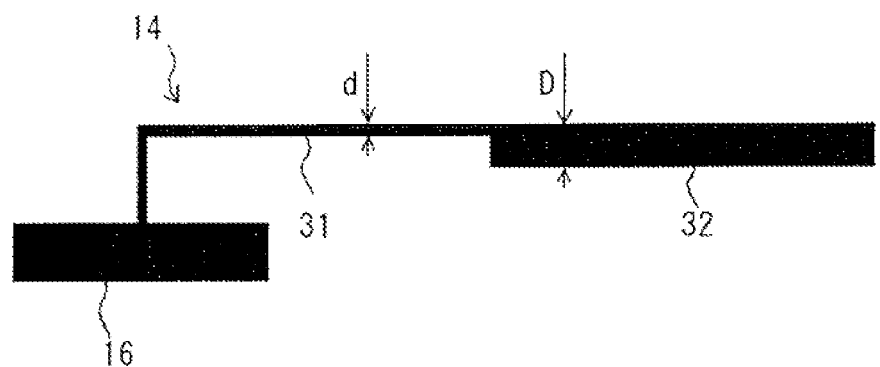
FIG. 5 is intended for explanation of the line widths of the thinnest metal wire segment A and of the other metal wire segment B in a metal wire forming the peripheral wire unit.

FIG. 5 is intended for explanation of the line widths of the thinnest metal wire segment A and the other metal wire segment B in a metal wire forming the peripheral wire unit. The line width of the thinnest metal wire segment 31 (metal wire segment A) is d and the line width of the metal wire segment 32 (metal wire segment B) having a line width larger than that of the metal wire segment A is D, leading to $1.5 \times d \leq D \leq 3.0d$.

Figure 6:
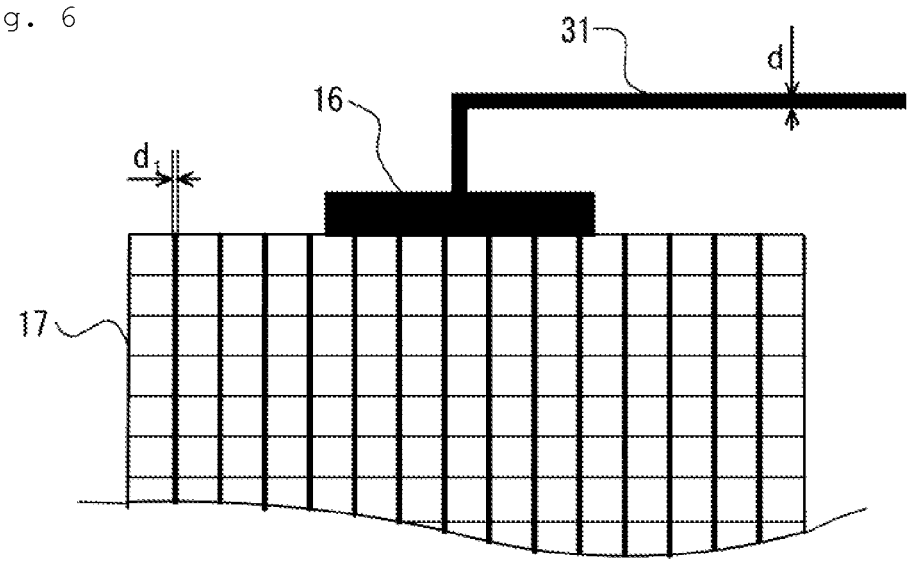
FIG. 6 is intended for explanation of the line widths of the thinnest metal wire segment A in a metal wire forming the peripheral wire unit and of the metal wires forming the optically transparent electrode unit.

FIG. 6 is intended for explanation of the line widths of the thinnest metal wire segment A in a metal wire forming the peripheral wire unit and the metal wires forming the optically transparent electrode unit. The line width of the thinnest metal wire segment 31 (metal wire segment A) is d and the line width of the metal wires forming the optically transparent electrode unit is $d_1$, leading to $1.2 \times d_1 \leq d \leq 20.0 \times d_1$.

In the above described FIG. 1, the optically transparent electrode 111 may be provided with, in addition to the support 11 and the conductor 12, a publicly known layer, such as a hard coating layer, an antireflection layer, an adhesive layer, an antiglare layer, etc. on the electrode pattern (on the conductor 12) or on the support 11 (on the opposite side to the conductor 12).

EXAMPLES

Hereinafter, the present invention will be illustrated in more detail by Examples, but the present invention is not limited thereto. Various alterations and modifications may be made without departing from the technical scope of the invention.

Example 1

As an optically transparent support, a 100-μm-thick polyethylene terephthalate film was used. The total light transmittance of this optically transparent support was 91%.

Next, in accordance with the following formulation, a physical development nuclei coating liquid was prepared, applied onto the optically transparent support, and dried to provide a physical development nuclei layer.

| <Preparation of palladium sulfide sol> | | |
|---|---|---|
| Liquid A | Palladium chloride | 5 g |
| | Hydrochloric acid | 40 mL |
| | Distilled water | 1000 mL |
| Liquid B | Sodium sulfide | 8.6 g |
| | Distilled water | 1000 mL |

Liquid A and Liquid B were mixed with stirring for 30 minutes, and then passed through a column filled up with an ion exchange resin to give a palladium sulfide sol.

| <Preparation of physical development nuclei coating liquid> | |
|---|---|
| | per m² |
| The above-prepared palladium sulfide sol | 0.4 mg |
| 2 mass % glyoxal aqueous solution | 0.2 mL |
| Surfactant (S-1) | 4 mg |
| Denacol EX-830 | 50 mg |
| (Polyethylene glycol diglycidyl ether made by Nagase Chemtex Corp.) | |
| 10 mass % SP-200 aqueous solution | 0.5 mg |
| (Polyethyleneimine made by Nippon Shokubai Co., Ltd.; average molecular weight: 10,000) | |

Subsequently, an intermediate layer, a silver halide emulsion layer, and a protective layer, of which the compositions are shown below, were applied in this order (from closest to the optically transparent support) onto the above physical development nuclei layer, and dried to give a silver halide photosensitive material 1. The silver halide emulsion was produced by a general double jet mixing method for photographic silver halide emulsions. The silver halide emulsion was prepared using 95 mol % of silver chloride and 5 mol % of silver bromide so as to have an average particle diameter of 0.15 μm. The obtained silver halide emulsion was subjected to gold and sulfur sensitization using sodium thiosulfate and chloroauric acid by the usual method. The silver halide emulsion obtained in this way contains 0.5 g of gelatin per gram of silver.

| <Composition of intermediate layer/per m²> | |
|---|---|
| Gelatin | 0.5 g |
| Surfactant (S-1) | 5 mg |
| Dye 1 | 0.1 g |

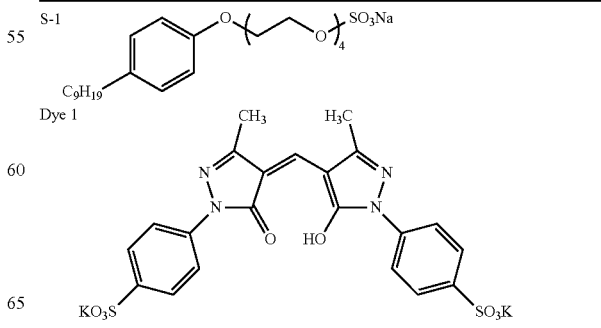

| <Composition of silver halide emulsion layer/per m²> | |
|---|---|
| Gelatin | 0.5 g |
| Silver halide emulsion | Equivalent of 3.0 g of silver |
| 1-Phenyl-5-mercaptotetrazole | 3 mg |
| Surfactant (S-1) | 20 mg |

| <Composition of protective layer/per m²> | |
|---|---|
| Gelatin | 1 g |
| Amorphous silica matting agent (average particle diameter: 3.5 μm) | 10 mg |
| Surfactant (S-1) | 10 mg |

A transparent manuscript 1 having the pattern of FIG. 2 and having the pattern of FIG. 3 at the peripheral wire unit was prepared.

The grid-like conductive section 17 of the transparent manuscript 1 is formed of unit lattices each of which consists of a 0.3-mm (grid interval) square. The unit lattice in the grid-like conductive section 17 is formed of thin lines 7 μm in width. The unit lattice in the broken mesh section 18 is formed of thin lines 8 μm in width. The broken mesh section 18 has a 10-μm line break in every 100 μm. In the transparent manuscript 1, the line width of the thinnest metal wire segment forming the peripheral wiring unit is 50 μm, the connector unit 15 is formed of a line having a width of 1 mm and a length of 10 mm, and the junction 16 is formed of a line having a width of 3 mm and a length of 1 mm. Regarding the peripheral wires connected to the connectors A1 to A6, the wire part excluding the connector unit 15 and the junction 16 is formed of a wire segment having a line width of 50 μm and a wire segment having a line width of 100 μm. The 50-μm wire, the 100-μm wire, the connector unit 15, and the junction 16 are connected with each other in a direct manner, not in the form of gradually increasing line width. Table 1 shows the ratio of the total length of the 50-μm wire relative to the total length of the 100-μm wire in each peripheral wire. Regarding the peripheral wire connected to the connector A7, the wire part excluding the connector unit 15 and the junction 16 is formed of only a 50-μm wire. Also, in each of the peripheral wires including the connectors A1 to A6, the total length of the 50-μm wire and the 100-μm wire is 60% or more relative to the total length of the peripheral wire.

The surface of the silver halide emulsion layer side of the silver halide photosensitive material 1 obtained as above was brought into close contact with the electrode pattern surface of the transparent manuscript 1, and exposure was performed, through a resin filter which cuts off light of a wavelength below 400 nm, using a contact printer having a mercury lamp as a light source. In other Examples and Comparative Examples described later, the surfaces brought into close contact at the time of exposure are the same as in Example 1.

Subsequently, after immersion in the diffusion transfer developer shown below at 20° C. for 60 seconds, the silver halide emulsion layer, the intermediate layer, and the protective layer were washed off with water. Drying was performed to give an optically transparent conductive electrode 1 having a silver pattern the same as the pattern of the transparent manuscript 1. The image of the silver pattern of the obtained optically transparent conductive electrode 1 has the exactly same shape and line width as those of the transparent manuscript 1. The thickness of the metal wire was 0.12 μm, the aperture ratio of the grid-like conductive section 17 was 95.4%, and the aperture ratio of the broken mesh section 18 was 95.2%.

| <Composition of diffusion transfer developer> | |
|---|---|
| Potassium hydroxide | 25 g |
| Hydroquinone | 18 g |
| 1-Phenyl-3-pyrazolidone | 2 g |
| Potassium sulfite | 80 g |
| N-methylethanolamine | 15 g |
| Potassium bromide | 1.2 g |

The total volume was made up to 1000 mL with water, and the pH was adjusted to 12.2.

<Evaluation of Corrosiveness>

Onto the optically transparent electrode unit of the obtained optically transparent electrode 1, the weak adhesive surface of a piece of Neo Fix 100 (two-sided adhesive tape made by Nichiei Kakoh Co., Ltd.) was placed. After this was left at 60° C. and at a relative humidity of 90% for 1000 hours, the evaluation of corrosiveness was performed. The criteria were as follows: when a metal wire had entirely turned black in the across-the-width direction at any site of the grid-like metal wire of the grid-like conductive section 17, the electrode was evaluated as poor; when a metal wire had turned black not entirely in the across-the-width direction but in a dot-like manner at any site of the grid-like metal wire, the electrode was evaluated as fair; and when no change was observed, the electrode was evaluated as good. The results are shown in Table 1.

<Evaluation of Plating Uniformity>

Plating of the obtained optically transparent electrode 1 was performed with use of Cu-5100 electroless copper plating solution made by Meltex Inc. at 60° C. for 5 minutes. The criteria were as follows: when the entire pattern was copper-colored, the electrode was evaluated as good; when a part of the pattern was thinly copper-colored, the electrode was evaluated as fair; and when apart of the pattern was not at all covered with copper and silver was exposed, the electrode was evaluated as poor. The results are shown in Table 1.

Example 2

The same procedure was performed as in Example 1 except that a transparent manuscript 2 having a ratio of the 50-μm wire to the 100-μm wire in each peripheral wire as shown in Table 1 was used instead of the transparent manuscript 1 prepared in Example 1, and an optically transparent electrode 2 was obtained. The obtained electrode was evaluated as in Example 1. The results are shown in Table 1. Regarding the peripheral wires connected to the connectors A4 to A7, the wire part excluding the connector unit and the junction is formed of only a 50-μm wire.

Example 3

The same procedure was performed as in Example 1 except that a transparent manuscript 3 having a ratio of the 50-μm wire to the 100-μm wire in each peripheral wire as shown in Table 1 was used instead of the transparent manuscript 1 prepared in Example 1, and an optically transparent electrode 3 was obtained. The obtained electrode was evaluated as in Example 1. The results are shown in Table 1. Regarding the peripheral wires connected to the connectors A3 and A5 to A7, the wire part excluding the connector unit and the junction is formed of only a 50-μm wire.

Comparative Example 1

The same procedure was performed as in Example 1 except that a transparent manuscript 4 having a ratio of the 50-μm wire to the 100-μm wire in each peripheral wire as shown in Table 1 was used instead of the transparent manuscript 1 prepared in Example 1, and an optically transparent electrode of Comparative Example 1 was obtained. The obtained electrode was evaluated as in Example 1. The results are shown in Table 1. Regarding the peripheral wires connected to the connectors A3 to A7, the wire part excluding the connector unit and the junction is formed of only a 50-μm wire.

Comparative Example 2

The same procedure was performed as in Example 1 except that a transparent manuscript 5, in which the ratio of the 50-μm wire to the 100-μm wire in each peripheral wire was as shown in Table 1 and each wire part excluding the connector unit and the junction in the peripheral wires connected to the connectors A3 to A7 was formed of only a 100-μm wire, was used instead of the transparent manuscript 1 prepared in Example 1, and an optically transparent electrode of Comparative Example 2 was obtained. The obtained electrode was evaluated as in Example 1. The results are shown in Table 1.

Example 4

The same procedure was performed as in Example 1 except that a transparent manuscript 6, which has the same shape as that of the transparent manuscript 1 except for using a 140-μm wire instead of the 100-μm wire, was used instead of the transparent manuscript 1 prepared in Example 1, and an optically transparent electrode 4 was obtained. The obtained electrode was evaluated as in Example 1. The results are shown in Table 1.

Example 5

The same procedure was performed as in Example 1 except that a transparent manuscript 7, which has the same shape as that of the transparent manuscript 1 except for using a 120-μm wire instead of the 100-μm wire, was used instead of the transparent manuscript 1 prepared in Example 1, and an optically transparent electrode 5 was obtained. The obtained electrode was evaluated as in Example 1. The results are shown in Table 1.

Comparative Example 3

The same procedure was performed as in Example 1 except that a transparent manuscript 8, which has the same shape as that of the transparent manuscript 1 except for using a 160-μm wire instead of the 100-μm wire, was used instead of the transparent manuscript 1 prepared in Example 1, and an optically transparent electrode of Comparative Example 3 was obtained. The obtained electrode was evaluated as in Example 1. The results are shown in Table 1.

Comparative Example 4

The same procedure was performed as in Example 1 except that a transparent manuscript 9, which has the same shape as that of the transparent manuscript 1 except for using a 55-μm wire instead of the 100-μm wire, was used instead of the transparent manuscript 1 prepared in Example 1, and an optically transparent electrode of Comparative Example 4 was obtained. The obtained electrode was evaluated as in Example 1. The results are shown in Table 1.

Example 6

The same procedure was performed as in Example 1 except that a transparent manuscript 10, which has the same shape as that of the transparent manuscript 1 except for using a 75-μm wire instead of the 100-μm wire, was used instead of the transparent manuscript 1 prepared in Example 1, and an optically transparent electrode 6 was obtained. The obtained electrode was evaluated as in Example 1. The results are shown in Table 1.

Example 7

The same procedure was performed as in Example 1 except that a transparent manuscript 11, which has the same shape as that of the transparent manuscript 1 except for using a 9.8-μm wire instead of the 50-μm wire of the transparent manuscript 1 and a 19.6-μm wire instead of the 100-μm wire of the transparent manuscript 1, and the wire part excluding the connector unit and the junction in the peripheral wire connected to the connector A7 was formed of only a 9.8-μm wire, was used instead of the transparent manuscript 1 prepared in Example 1, and an optically transparent electrode 7 was obtained. The obtained electrode was evaluated as in Example 1. The results are shown in Table 1.

Comparative Example 5

The same procedure was performed as in Example 1 except that a transparent manuscript 12, which has the same shape as that of the transparent manuscript 1 except for using a 7-μm wire instead of the 50-μm wire of the transparent manuscript 1 and a 14-μm wire instead of the 100-μm wire of the transparent manuscript 1, and the wire part excluding the connector unit and the junction of the peripheral wire connected to the connector A7 was formed of only a 7-μm wire, was used instead of the transparent manuscript 1 prepared in Example 1, and an optically transparent electrode of Comparative Example 5 was obtained. The obtained electrode was evaluated as in Example 1. The results are shown in Table 1.

Example 8

The same procedure was performed as in Example 1 except that a transparent manuscript 13, which has the same shape as that of the transparent manuscript 1 except for using a 130-μm wire instead of the 50-μm wire of the transparent manuscript 1 and a 260-μm wire instead of the 100-μm wire of the transparent manuscript 1, and the wire part excluding the connector unit and the junction of the peripheral wire connected to the connector A7 was formed of only a 130-μm wire, was used instead of the transparent manuscript 1 prepared in Example 1, and an optically transparent electrode 8 was obtained. The obtained electrode was evaluated as in Example 1. The results are shown in Table 1.

Comparative Example 6

The same procedure was performed as in Example 1 except that a transparent manuscript 14, which has the same shape as that of the transparent manuscript 1 except for using a 150-μm wire instead of the 50-μm wire of the transparent manuscript 1 and a 300-μm wire instead of the 100-μm wire of the transparent manuscript 1, and the wire part excluding the connector unit and the junction of the peripheral wire connected to the connector A7 was formed of only a 150-μm wire, was used instead of the transparent manuscript 1 prepared in Example 1, and an optically transparent electrode of Comparative Example 6 was obtained. The obtained electrode was evaluated as in Example 1. The results are shown in Table 1.

Example 9

The same procedure was performed as in Example 1 except that a transparent manuscript 15 having a ratio of the 50-μm wire to the 100-μm wherein each peripheral wire as shown in Table 1 was used instead of the transparent manuscript 2 prepared in Example 2, and an optically transparent electrode 9 was obtained. The obtained electrode was evaluated as in Example 1. The results are shown in Table 1.

Comparative Example 7

The same procedure was performed as in Example 1 except that a transparent manuscript 16 having a ratio of the 50-μm wire to the 100-μm wherein each peripheral wire as shown in Table 1 was used instead of the transparent manuscript 2 prepared in Example 2, and an optically transparent electrode of Comparative Example 7 was obtained. The obtained electrode was evaluated as in Example 1. The results are shown in Table 1.

Example 10

The same procedure was performed as in Example 1 except that a transparent manuscript 17 having a ratio of the 50-μm wire to the 100-μm wire in each peripheral wire as shown in Table 1 was used instead of the transparent manuscript 2 prepared in Example 2, and an optically transparent electrode 10 was obtained. The obtained electrode was evaluated as in Example 1. The results are shown in Table 1.

Comparative Example 8

The same procedure was performed as in Example 1 except that a transparent manuscript 18 having a ratio of the 50-μm wire to the 100-μm wherein each peripheral wire as shown in Table 1 was used instead of the transparent manuscript 2 prepared in Example 2, and an optically transparent electrode of Comparative Example 8 was obtained. The obtained electrode was evaluated as in Example 1. The results are shown in Table 1.

TABLE 1

| Optically transparent electrode | A1 Ratio | A2 Ratio | A3 Ratio | A4 Ratio | A5 Ratio | A6 Ratio | A7 Ratio | Corrosiveness | Plating uniformity | Note |
|---|---|---|---|---|---|---|---|---|---|---|
| 1 | 0.15 | 0.646 | 3.48 | 2.6 | 1.3 | 0.2 | — | Good | Good | Present invention |
| 2 | 0.15 | 0.35 | 3.48 | — | — | — | — | Good | Good | Present invention |
| 3 | 0.15 | 0.35 | — | 3.5 | — | — | — | Good | Fair | Present invention |
| Comparative Example 1 | 0.15 | 0.35 | — | — | — | — | — | Poor | Poor | Comparative Example |
| Comparative Example 2 | 0.15 | 0.35 | — | — | — | — | — | Poor | Poor | Comparative Example |
| 4 | 0.15 | 0.646 | 3.48 | 2.6 | 1.3 | 0.2 | — | Fair | Good | Present invention |
| 5 | 0.15 | 0.646 | 3.48 | 2.6 | 1.3 | 0.2 | — | Good | Good | Present invention |
| Comparative Example 3 | 0.15 | 0.646 | 3.48 | 2.6 | 1.3 | 0.2 | — | Poor | Good | Comparative Example |
| Comparative Example 4 | 0.15 | 0.646 | 3.48 | 2.6 | 1.3 | 0.2 | — | Poor | Good | Comparative Example |
| 6 | 0.15 | 0.646 | 3.48 | 2.6 | 1.3 | 0.2 | — | Fair | Good | Present invention |
| 7 | 0.15 | 0.646 | 3.48 | 2.6 | 1.3 | 0.2 | — | Fair | Good | Present invention |
| Comparative Example 5 | 0.15 | 0.646 | 3.48 | 2.6 | 1.3 | 0.2 | — | Poor | Good | Comparative Example |
| 8 | 0.15 | 0.646 | 3.48 | 2.6 | 1.3 | 0.2 | — | Good | Fair | Present invention |
| Comparative Example 6 | 0.15 | 0.646 | 3.48 | 2.6 | 1.3 | 0.2 | — | Fair | Poor | Comparative Example |
| 9 | 0.012 | 0.012 | 0.012 | — | — | — | — | Good | Fair | Present invention |
| Comparative Example 7 | 0.008 | 0.008 | 0.008 | — | — | — | — | Poor | Fair | Comparative Example |
| 10 | 38 | 38 | 38 | — | — | — | — | Good | Fair | Present invention |
| Comparative Example 8 | 42 | 42 | 42 | — | — | — | — | Poor | Fair | Comparative Example |

Table 1 shows the following. The optically transparent electrodes of Examples 1 to 10 are provided with all the features of the present invention, and therefore have practically sufficient characteristics in terms of corrosiveness and plating uniformity. However, the optically transparent electrodes of Comparative Examples 1 and 2, where, defining the thinnest segment of a metal wire forming the peripheral wire unit as metal wire segment A and the other metal wire segment electrically connected with the metal wire segment A as metal wire segment B, the number of peripheral wires where the total length of the metal wire segment A is 0.01 to 40 times the total length of the metal wire segment B of the same wire is 28.6% of the total number of wires in the peripheral wire unit, show unfavorable corrosiveness and plating uniformity. The optically transparent electrode of Comparative Example 3, where the line width of the metal wire segment B is 3.2 times the line width of the metal wire segment A, shows unfavorable corrosiveness. The optically transparent electrode of Comparative Example 4, where the line width of the metal wire segment B is 1.1 times the line width of the metal wire segment A, shows unfavorable corrosiveness. The optically transparent electrode of Comparative Example 5, where the line width of the metal wire segment A is 1.0 time the line width of the metal wires forming the optically transparent electrode unit, shows unfavorable corrosiveness. The optically transparent electrode of Comparative Example 6, where the line width of the metal wire segment A is 21.4 times the line width of the metal wires forming the optically transparent electrode unit, shows unfavorable plating uniformity. The optically transparent electrode of Comparative Example 7, where the total length of the metal wire segment A in a single peripheral wire is 0.008 time the total length of the metal wire segment B in the same wire, shows unfavorable corrosiveness. The optically transparent electrode of Comparative Example 8, where the total length of the metal wire segment A in a single peripheral wire is 42 times the total length of the metal wire segment B in the same wire, shows unfavorable corrosiveness.

REFERENCE SIGNS LIST

11 Support
12 Conductor
13 Optically transparent electrode unit
14 Peripheral wire unit
15 Connector unit
16 Junction
17 Grid-like conductive section
18 Broken mesh section
31, 32 Metal wire segment
111 Optically transparent electrode
A1, A2, A3, A4, A5, A6, and A7 Connectors

The invention claimed is:
1. An optically transparent electrode comprising, on a support, an optically transparent electrode unit and a peripheral wire unit formed of at least one peripheral wire, of which one end is electrically connected with the optically transparent electrode unit, the optically transparent electrode unit and the peripheral wire unit being formed of the same metal, the line width of at least one metal wire forming the peripheral wire unit not being uniform, the at least one metal wire being composed of a thinner metal wire segment A and a thicker metal wire segment B electrically connected with the metal wire segment A, the line width of the metal wire segment A being 1.2 to 20 times the line width of the metal wires forming the optically transparent electrode unit, the line width of the metal wire segment B being 1.5 to 3 times the line width of the metal wire segment A, and at least 40% of the total number of wires in the peripheral wire unit having a total length of the metal wire segment A of a single peripheral wire being 0.01 to 40 times the total length of the metal wire segment B of the same wire.

* * * * *